(12) United States Patent
Kan et al.

(10) Patent No.: US 9,351,036 B2
(45) Date of Patent: May 24, 2016

(54) CHANNEL RECEIVING APPARATUS AND RELATED CHANNEL RECEIVING METHOD

(71) Applicant: Rafael microelectronics, Inc., Hsinchu (TW)

(72) Inventors: Meng-Ping Kan, Hsinchu (TW); Chun-An Hsieh, Taipei (TW)

(73) Assignee: Rafael microelectronics, Inc., Hsinchu (TW)

( * ) Notice: Subject to any disclaimer, the term of this patent is extended or adjusted under 35 U.S.C. 154(b) by 203 days.

(21) Appl. No.: 14/290,940

(22) Filed: May 29, 2014

(65) Prior Publication Data

US 2015/0350720 A1 Dec. 3, 2015

(51) Int. Cl.
| | |
|---|---|
| H04B 1/10 | (2006.01) |
| H04N 21/438 | (2011.01) |
| H04H 40/90 | (2008.01) |
| H04H 20/63 | (2008.01) |
| H03D 7/16 | (2006.01) |

(52) U.S. Cl.
CPC ........... *H04N 21/4383* (2013.01); *H03D 7/161* (2013.01); *H04H 20/63* (2013.01); *H04H 40/90* (2013.01)

(58) Field of Classification Search
CPC ... H04N 21/4383; H04H 40/90; H04H 20/63; H03D 7/161; H04B 1/1036; H04B 1/109; H04B 7/18513
USPC .................................. 375/316, 346, 344, 349
See application file for complete search history.

(56) References Cited

U.S. PATENT DOCUMENTS

| | | | | |
|---|---|---|---|---|
| 5,115,514 | A * | 5/1992 | Leslie ................ | H04B 7/15578 455/17 |
| 9,100,088 | B2 * | 8/2015 | Pullela ............... | H04B 7/18513 |
| 2002/0122140 | A1 * | 9/2002 | Cowley .................. | H03D 7/161 348/731 |
| 2006/0048197 | A1 * | 3/2006 | Petruzzelli ............. | H04H 40/90 725/100 |
| 2006/0258315 | A1 * | 11/2006 | Fein ........................ | H04B 1/109 455/295 |
| 2011/0009161 | A1 * | 1/2011 | Trikha .................. | H04B 1/1036 455/552.1 |
| 2011/0117870 | A1 * | 5/2011 | Pera ....................... | H04B 1/1036 455/307 |
| 2013/0332967 | A1 * | 12/2013 | Chang .................... | H04H 40/90 725/68 |
| 2015/0214958 | A1 * | 7/2015 | Ramesh .................... | H03L 7/00 331/34 |

FOREIGN PATENT DOCUMENTS

EP  2 182 726 A2  5/2010
WO  2008148125 A1  12/2008

* cited by examiner

*Primary Examiner* — Phuong Phu
(74) *Attorney, Agent, or Firm* — Winston Hsu; Scott Margo (57) ABSTRACT

A channel receiving apparatus includes: a first modulating device converts a first channel into a first predetermined frequency according to a first oscillating signal and a second oscillating signal; and a second modulating device converts a second channel into a second predetermined frequency according to a third oscillating signal and a fourth oscillating signal; wherein the first oscillating signal has a first frequency, the second oscillating signal has a second frequency, the third oscillating signal has a third frequency, and the fourth oscillating signal has a fourth frequency, when the third frequency is substantially equal to the first frequency, the third oscillating signal is arranged to be shifted by a predetermined frequency range to have a fifth frequency different from the first frequency, and when the second frequency is substantially equal to the first frequency, the second frequency and the first frequency are shifted by the predetermined frequency range.

26 Claims, 9 Drawing Sheets

CHANNEL RECEIVING APPARATUS AND RELATED CHANNEL RECEIVING METHOD

BACKGROUND OF THE INVENTION

1. Field of the Invention

The present invention relates to a channel receiving apparatus for receiving satellite signals and the method thereof, and more particularly to a channel receiving apparatus using both the down-conversion and up-conversion for receiving satellite signals and the method thereof.

2. Description of the Prior Art

In the field of satellite TV system, the channel stacking switch (CSS) technology is used to receive the RF signal from satellite outdoor unit to each set-top-box (STB) and to each tuner in each STB. More specifically, the CSS technology is capable of delivering multiple satellite channels on a single cable within the home. Conventionally, the CSS system is a direct conversion system that uses one oscillating signal to directly convert one channel signal into a user band signal having a required frequency. However, the frequency of the oscillating signal used to convert one channel signal in one signal band may equal to the frequency of another oscillating signal used to convert another channel signal in another signal band. When this happens, the two oscillating signals may interfere with each other, and consequently make the corresponding two channel signals deviated from their user bands respectively. Therefore, how to precisely receive a plurality of channel signals in a plurality of signal bands is an urgent problem in the field of satellite TV system.

SUMMARY OF THE INVENTION

One of the objectives of the present invention is to provide a channel receiving apparatus using both the down-conversion and up-conversion for receiving satellite signals and the method thereof.

According to a first embodiment, a channel receiving apparatus is provided. The channel receiving apparatus comprises a first modulating device and a second modulating device. The first modulating device is arranged to convert a first channel into a first predetermined frequency according to a first oscillating signal and a second oscillating signal. The second modulating device is arranged to convert a second channel into a second predetermined frequency according to a third oscillating signal and a fourth oscillating signal; wherein the first oscillating signal has a first frequency, the second oscillating signal has a second frequency, the third oscillating signal has a third frequency, and the fourth oscillating signal has a fourth frequency, and when the third frequency is substantially equal to the first frequency, the third oscillating signal is arranged to be shifted by a predetermined frequency range to have a fifth frequency different from the first frequency.

According to a second embodiment, a channel receiving method is provided. The channel receiving method comprises the steps of: converting a first channel into a first predetermined frequency according to a first oscillating signal and a second oscillating signal; converting a second channel into a second predetermined frequency according to a third oscillating signal and a fourth oscillating signal, wherein the first oscillating signal has a first frequency, the second oscillating signal has a second frequency, the third oscillating signal has a third frequency, and the fourth oscillating signal has a fourth frequency; and when the third frequency is substantially equal to the first frequency, arranging the third oscillating signal to be shifted by a predetermined frequency range to have a fifth frequency different from the first frequency.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
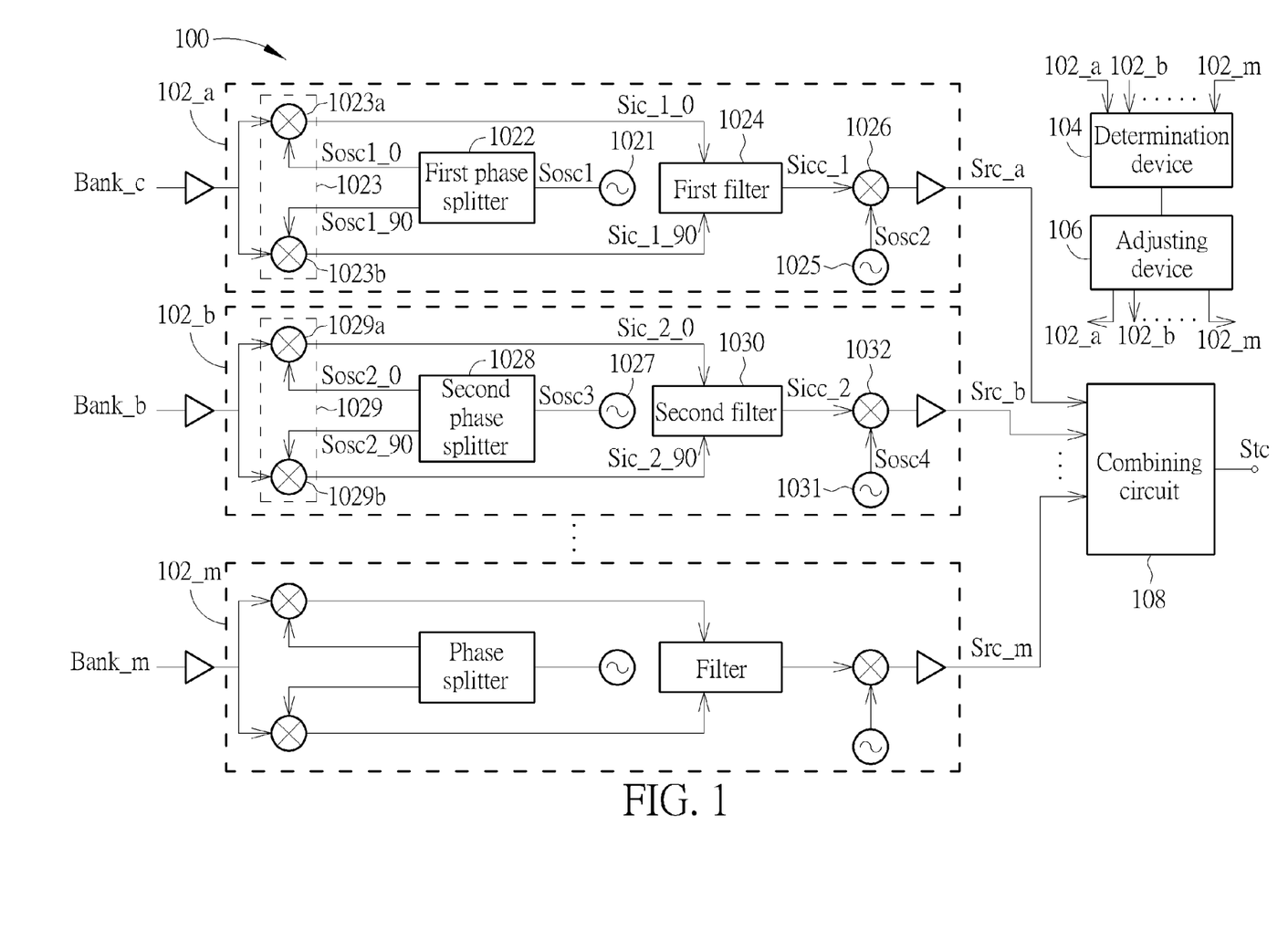
FIG. 1 is a diagram illustrating a channel receiving apparatus according to an embodiment of the present invention.

Please refer to FIG. 1, which is a diagram illustrating a channel receiving apparatus 100 according to an embodiment of the present invention. The channel receiving apparatus 100 comprises a plurality modulating devices 102_a~102_m for converting a plurality of channels FD_a~FD_m in a plurality of RF signals into a plurality of predetermined frequencies (i.e. a plurality of user bands) UB_a~UB_m respectively. The plurality modulating devices 102_a~102_m corresponds to a plurality of users respectively. For illustration purposes, the plurality of RF signals are illustrated as a plurality of banks (i.e. Bank_a~Bank_m) respectively in the following description. In other words, the term "Bank" in this embodiment is just the name of an input RF signal. One modulating device is arranged to receive one bank. For example, in this embodiment, the first modulating device 102_a is arranged to receive the Bank_c, the second modulating device 102_b is arranged to receive the Bank_b, and the third modulating device 102_c is arranged to receive the Bank_a. It is noted that the assignments between the banks and the modulating devices may be a predetermined process. Moreover, the plurality of RF signals (i.e. Bank_a~Bank_m) are outputted from an outdoor satellite receiving unit (ODU) or a down-converter that receives the satellite signals having frequency ranges of 10.7~12.75 GHz. Each of the plurality of RF signals has frequency range of 250~2150 MHz. In each frequency range 250~2150 MHz, there has a plurality of channels, and each channel has a bandwidth approximately equal to 50 MHz as shown in FIG. 2.

Figure 2:
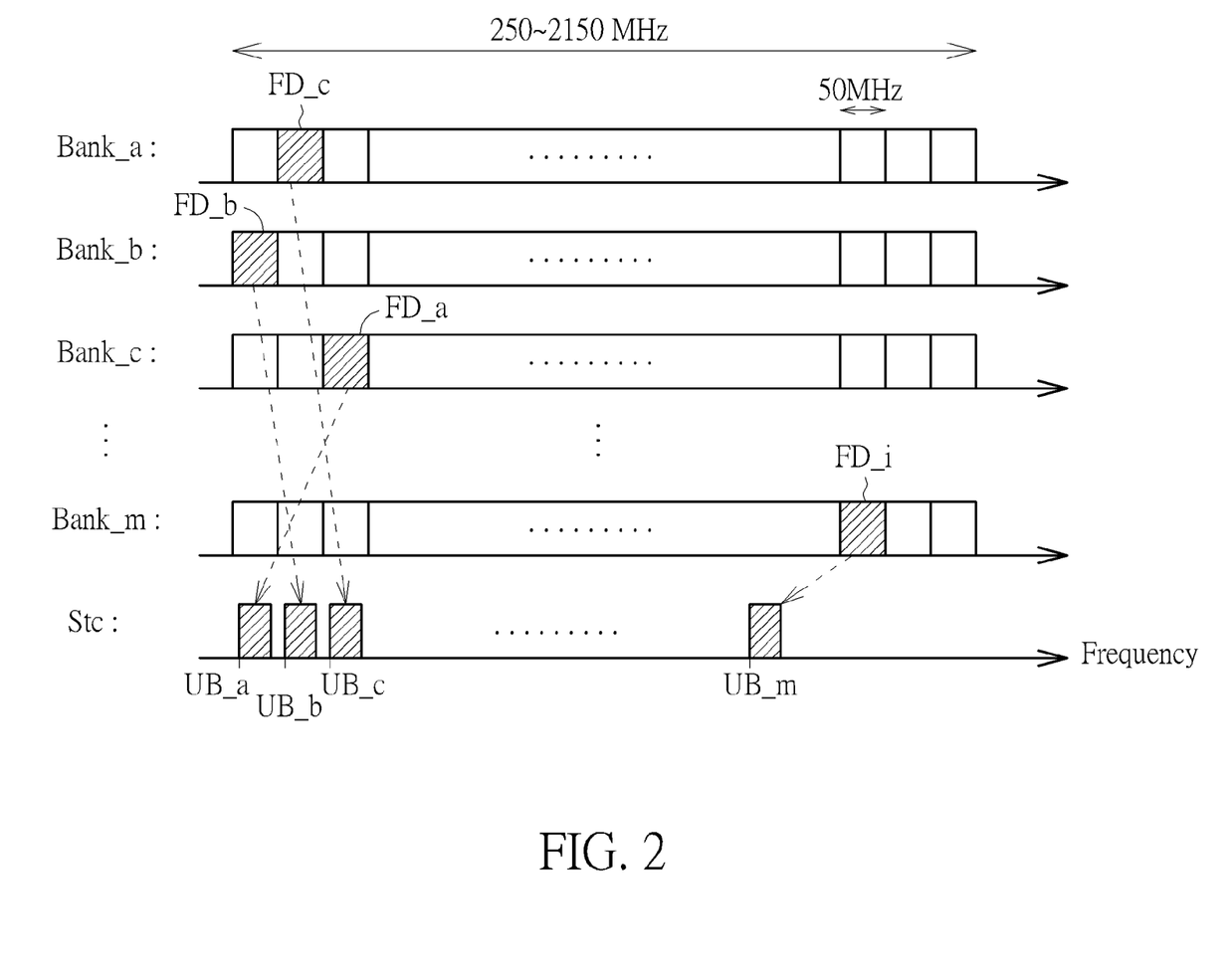
FIG. 2 is a diagram illustrating an example of receiving a plurality of channels into a plurality of predetermined frequencies according to an embodiment of the present invention.

Please refer to FIG. 2, which is a diagram illustrating an example of receiving the plurality of channels FD_a~FD_m into the plurality of predetermined frequencies UB_a~UB_m according to an embodiment of the present invention. For the example of the first user, the first user controls the first modulating device 102_a to convert one channel (e.g. the channel FD_a) in the Bank_c into the first predetermined frequency UB_a. For the second user, the second user controls the second modulating device 102_b to convert one channel (e.g. the channel FD_b) in the Bank_b into the second predetermined frequency UB_b. For the third user, the third user controls the third modulating device 102_c to convert one channel (e.g. the channel FD_c) in the Bank_a into the third predetermined frequency UB_c, and etc. Therefore, each modulating device can selectively convert any channel in the corresponding bank into the predetermined frequency depending on the user's selection. It is noted that, in this example, although the first predetermined frequency UB_a is assigned to the first user, the second predetermined frequency UB_b is assigned to the second user, and the third predetermined frequency UB_c is assigned to the third user, this is not a limitation of the present invention.

In this embodiment, the channel receiving apparatus 100 further comprises a determination device 104, an adjusting device 106, and a combining circuit 108. The determination device 104 is coupled to the plurality of modulating devices 102_a~102_m for determining if the frequency of an oscillating signal used by one modulating device is substantially equal to the frequency of another oscillating signal used by another modulating device. The adjusting device 106 is coupled to the determination device 104 for adjusting the frequency of the another oscillating signal to be shifted by the predetermined frequency range when the determination device determines that the frequency of the another oscillating signal is substantially equal to the frequency of the oscillating signal. The combining circuit 108 is coupled to the plurality of modulating devices 102_a~102_m for combining a plurality of received channels Src_a~Src_m generated by the plurality of modulating devices 102_a~102_m, respectively, to generate a stacked receiving channel Stc as shown in FIG. 2.

It is noted that the description of the following paragraphs mainly focuses on using two modulating devices, i.e. the modulating devices 102_a and 102_b, to describe the detailed feature of the channel receiving apparatus 100. One ordinary skill in the art is appreciated to understand this is just for the explanation of the channel receiving apparatus 100, and not the limitation of the present invention. The other modulating devices may have the similar characteristic.

Please to FIG. 1 in conjunction with FIG. 2, when the channel receiving apparatus 100 is under operation, the first modulating device 102_a is capable of converting any channel in the Bank_c into the first predetermined frequency UB_a according to a first oscillating signal Sosc1 and a second oscillating signal Sosc2. The second modulating device 102_b is capable of converting any channel in the Bank_b into second predetermined frequency UB_b according to a third oscillating signal Sosc3 and a fourth oscillating signal Sosc4. In this embodiment, the first oscillating signal Sosc1 has a first frequency f1, the second oscillating signal Sosc2 has a second frequency f2, the third oscillating signal Sosc3 has a third frequency f3, and the fourth oscillating signal Sosc4 has a fourth frequency f4. More specifically, the first modulating device 102_a is first arranged to down-convert a first selected channel (e.g. FD_a) in the RF signal (e.g. Bank_c) into a first intermediate frequency Fi_1 to generate a first intermediate channel Sic_1_0, Sic_1_90 according to the first oscillating signal Sosc1 and to up-convert the first intermediate channel Sic_1_0, Sic_1_90 to generate a first received channel Src_a having the first predetermined frequency UB_a according to the second oscillating signal Sosc2. The second modulating device 102_b is arranged to down-convert a second selected channel (e.g. FD_b) in the RF signal (e.g. Bank_b) into a second intermediate frequency Fi_2 to generate a second intermediate channel Sic_2_0, Sic_2_90 according to the third oscillating signal Sosc3 and to up-convert the second intermediate channel Sic_2_0, Sic_2_90 to generate the second received channel Src_b having the second predetermined frequency UB_b according to the fourth oscillating signal Sosc4.

More specifically, the first modulating device 102_a comprises a first synthesizer 1021, a first phase splitter 1022, a first mixing circuit 1023, a first filter 1024, a second synthesizer 1025, and a second mixing circuit 1026. The first synthesizer 1021 is arranged to generate the first oscillating signal Sosc1. The first phase splitter 1022 is coupled to the first synthesizer 1021 for generating a first in-phase oscillating signal Sosc1_0 and a first quadrature oscillating signal Sosc1_90 according to the first oscillating signal Sosc1, i.e. the first in-phase oscillating signal Sosc1_0 and the first quadrature oscillating signal Sosc1_90 has a phase difference of 90 degree. The first mixing circuit 1023 is arranged to modulate the channel FD_a in the Bank_c to generate a first in-phase intermediate channel Sic_1_0 having the first intermediate frequency Fi_1 and a first quadrature intermediate channel Sic_1_90 having the first intermediate frequency Fi_1 according to the first oscillating signal Sosc1. The first mixing circuit 1023 comprises a first mixer 1023a and a second mixer 1023b. The first mixer 1023a is arranged to mix the channel FD_a in the Bank_c by the first in-phase oscillating signal Sosc1_0 to generate the first in-phase intermediate channel Sic_1_0. The second mixer 1023b is arranged to mix the channel FD_a in the Bank_c by the first quadrature oscillating signal Sosc1_90 to generate the first quadrature intermediate channel Sic_1_90.

The first filter 1024 is coupled to the first mixer 1023a and the second mixer 1023b for filtering the first in-phase intermediate channel Sic_1_0 and the first quadrature intermediate channel Sic_1_90 to generate a first combined intermediate channel Sicc_1. In this embodiment, the first filter 1024 is an IMR (Image rejection) poly-phase rejection filter. Therefore, the first filter 1024 filters out the image signals of the first in-phase intermediate channel Sic_1_0 and the first quadrature intermediate channel Sic_1_90, and combines the first in-phase intermediate channel Sic_1_0 and the first quadrature intermediate channel Sic_1_90 to generate the first combined intermediate channel Sicc_1. It is noted that the first filter 1024 may also be arranged to first combine the first in-phase intermediate channel Sic_1_0 and the first quadrature intermediate channel Sic_1_90 to generate the first combined intermediate channel Sicc_1, and then to filter out the image signal of the first combined intermediate channel Sicc_1, which also belongs to the scope of the present invention. Moreover, the frequency of the first combined intermediate channel Sicc_1 is on the first intermediate frequency Fi_1.

The second synthesizer 1025 is arranged to generate the second oscillating signal Sosc2. The second mixing circuit 1026 is arranged to modulate/up-convert the first combined intermediate channel Sicc_1 to generate the first received channel Src_a having the first predetermined frequency UB_a, which is shown in FIG. 2, according to the second oscillating signal Sosc2. It should be noted that an amplifier/buffer may be placed after the second mixing circuit 1026 for providing gain to the first received channel Src_a. Another amplifier/buffer may be placed before the first mixing circuit 1023 for providing gain to the RF input signal (e.g. Band_c).

In addition, the second modulating device 102_b also comprises a first synthesizer 1027, a first phase splitter 1028, a first mixing circuit 1029, a first filter 1030, a second synthesizer 1031, and a second mixing circuit 1032. The first synthesizer 1027 is arranged to generate the third oscillating signal Sosc3. The first phase splitter 1028 is coupled to the first synthesizer 1027 for generating a second in-phase oscillating signal Sosc2_0 and a second quadrature oscillating signal Sosc2_90 according to the third oscillating signal Sosc3. Therefore, the second in-phase oscillating signal Sosc2_0 and the second quadrature oscillating signal Sosc2_90 has a phase difference of 90 degree. The first mixing circuit 1029 is arranged to modulate the channel FD_b in the Bank_b to generate a second in-phase intermediate channel Sic_2_0 having the second intermediate frequency Fi_2 and a second quadrature intermediate channel Sic_2_90 having the second intermediate frequency Fi_2 according to the third oscillating signal Sosc3. More specifically, the first mixing circuit 1029 comprises a first mixer 1029a and a second mixer 1029b. The first mixer 1029a is arranged to mix the channel FD_b in the Bank_b by the second in-phase oscillating signal Sosc2_0 to generate the second in-phase intermediate channel Sic_2_0. The second mixer 1029b is arranged to mix the channel FD_b in the Bank_b by the second quadrature oscillating signal Sosc2_90 to generate the second quadrature intermediate channel Sic_2_90.

The first filter 1030 is coupled to the first mixer 1029a and the second mixer 1029b for filtering the second in-phase intermediate channel Sic_2_0 and the second quadrature intermediate channel Sic_2_90 to generate a second combined intermediate channel Sicc_2. In this embodiment, the first filter 1029 is an IMR (Image rejection) poly-phase rejection filter. Therefore, the first filter 1030 filters out the image signals of the second in-phase intermediate channel Sic_2_0 and the second quadrature intermediate channel Sic_2_90, and combines the second in-phase intermediate channel Sic_2_0 and the first quadrature intermediate channel Sic_2_90 to generate the second combined intermediate channel Sicc_2. It is noted that the first filter 1030 may also be arranged to first combine the second in-phase intermediate channel Sic_2_0 and the second quadrature intermediate channel Sic_2_90 to generate the second combined intermediate channel Sicc_2, and then filter out the image signal of the second combined intermediate channel Sicc_2. Moreover, the frequency of the second combined intermediate channel Sicc_2 is on the second intermediate frequency Fi_2.

The second synthesizer 1031 is arranged to generate the fourth oscillating signal Sosc4. The second mixing circuit 1032 is arranged to modulate/up-convert the second combined intermediate channel Sicc_2 to generate the second received channel Src_b in the second predetermined frequency UB_b, which is shown in FIG. 2, according to the fourth oscillating signal Sosc4. It should be noted that an amplifier/buffer may be placed after the second mixing circuit 1032 for providing gain to the second received channel Src_b. Another amplifier/buffer may be placed before the first mixing circuit 1029 for providing gain to the RF input signal (e.g. Bank_b).

The combining circuit 108 is coupled to the outputs of the plurality modulating devices 102_a~102_m for combining the plurality of received channels Src_a~Src_m to generate the stacked receiving channel Stc.

When the channel receiving apparatus 100 is operating, the first frequency f1 of the first oscillating signal Sosc1 should not equal to the frequency f3 of the third oscillating signal Sosc3 because the first oscillating signal Sosc1 may interfere with the third oscillating signal Sosc3 if the first frequency f1 of the first oscillating signal Sosc1 is equal to the frequency f3 of the third oscillating signal Sosc3. However, under some circumstances, the first frequency f1 of the first oscillating signal Sosc1 may equal to the frequency f3 of the third oscillating signal Sosc3. When this happens, according to the present invention, one of the first oscillating signal Sosc1 and the third oscillating signal Sosc3 is arranged to shift a predetermined frequency range fs to make the first frequency f1 of the first oscillating signal Sosc1 different from the frequency f3 of the third oscillating signal Sosc3. In this embodiment, the third oscillating signal Sosc3 is arranged to shift a predetermined frequency range fs to have a fifth frequency f5 different from the first frequency f1. Meanwhile, the fourth oscillating signal Sosc4 is also arranged to shift the predetermined frequency range fs to have a sixth frequency f6 different from the fourth frequency f4.

Figure 3A:
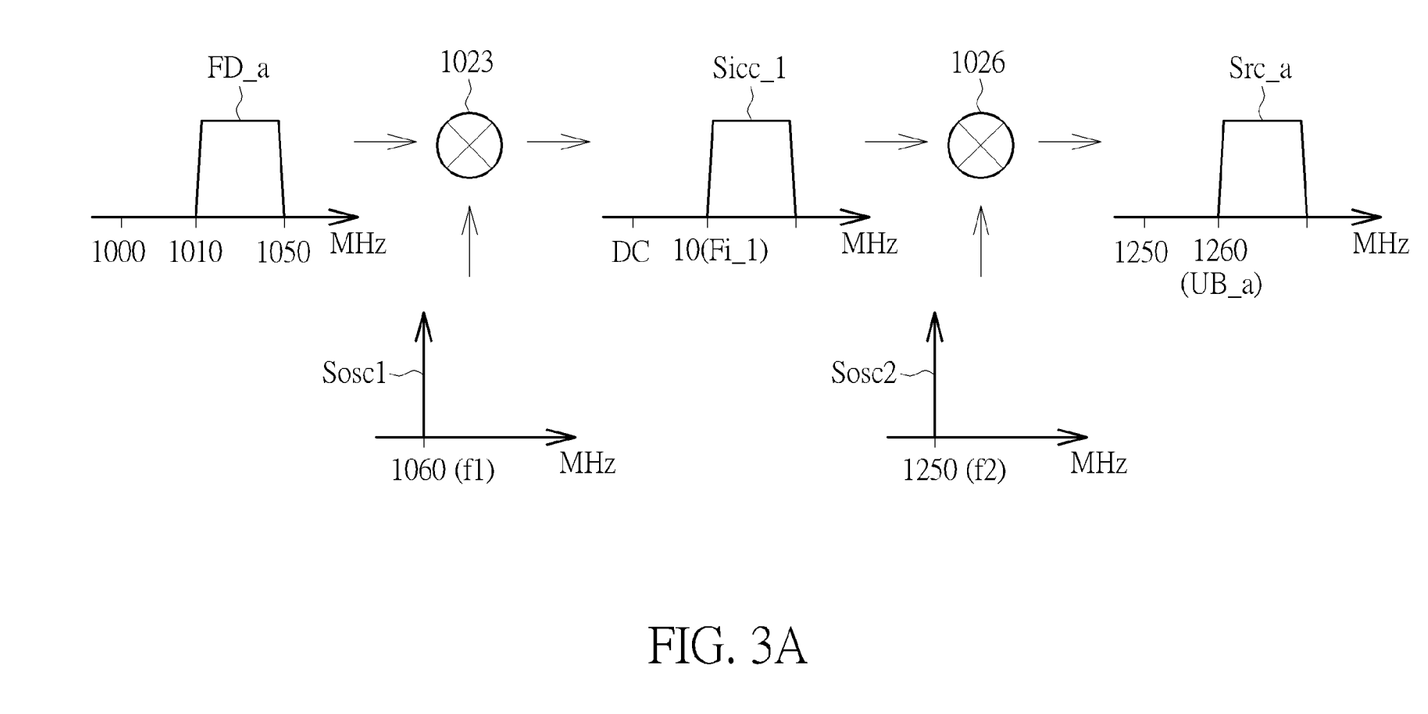
FIG. 3A is a spectrum diagram illustrating the receiving of a channel (e.g. FD_a) in an RF signal bank by using a first modulating device according to an embodiment of the present invention.

For example, if the user-band (i.e. the first predetermined frequency UB_a) in the stacked receiving channel Stc assigned for the first user is on 1260 MHz and if the frequency of the channel FD_a to be down-converted is on 1010 MHz, then the first frequency f1 of the first oscillating signal Sosc1 can be set to 1060 MHz to first down-convert/modulate the channel FD_a into the first combined intermediate channel Sicc_1 having the first intermediate frequency Fi_1 of 10 MHz, in which the first combined intermediate channel Sicc_1 can be viewed as a baseband signal. Then, the second frequency f2 of the second oscillating signal Sosc2 can be set to 1250 MHz to up-convert the first combined intermediate channel Sicc_1 into the first received channel Src_a having the first predetermined frequency UB_a of 1260 MHz as shown in FIG. 3A. FIG. 3A is a spectrum diagram illustrating the receiving of the channel FD_a in the Bank_c by using the first modulating device 102_a according to an embodiment of the present invention.

Figure 3B:
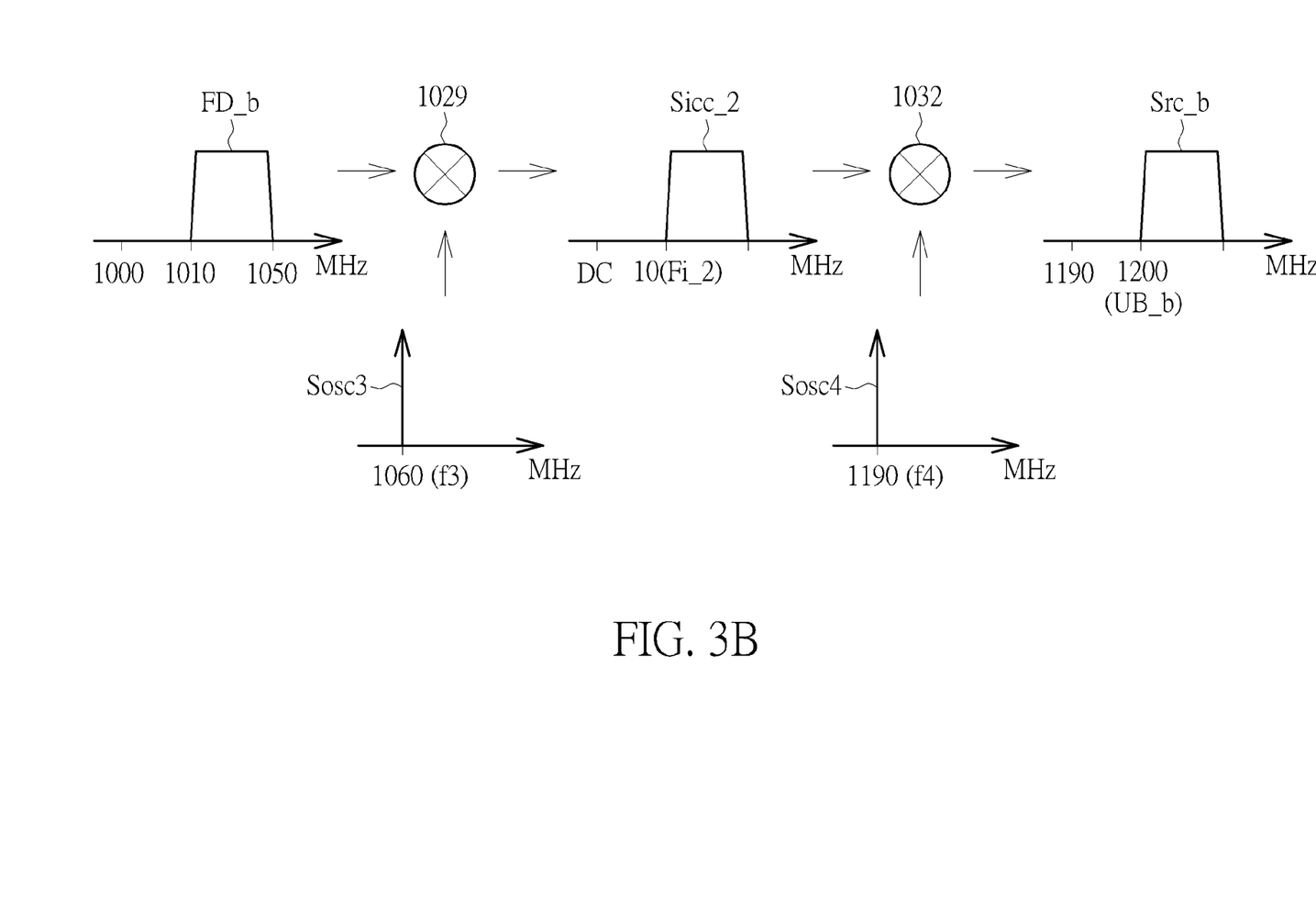
FIG. 3B is a spectrum diagram illustrating the receiving of a channel (e.g. FD_b) in an RF signal bank by using a second modulating device before the adjustment of an adjusting device according to an embodiment of the present invention.

Now, if the user-band (i.e. the second predetermined frequency UB_b) in the stacked receiving channel Stc assigned for the second user is on 1200 MHz and if the frequency of the channel FD_b to be down-converted is also on 1010 MHz, then the third frequency f3 of the third oscillating signal Sosc3 can be set to 1060 MHz to down-convert/modulate the channel FD_b into the second combined intermediate channel Sicc_2 having the second intermediate frequency Fi_2 of 10 MHz, in which the second combined intermediate channel Sicc_2 can be viewed as a baseband signal. Then, the fourth frequency f4 of the fourth oscillating signal Sosc3 can be set to 1190 MHz to up-convert the second combined intermediate channel Sicc_2 into the second received channel Src_b having the second predetermined frequency UB_b of 1200 MHz as shown in FIG. 3B. FIG. 3B is a spectrum diagram illustrating the receiving of the channel FD_b in the Bank_b by using the second modulating device 102_b before the adjustment of the adjusting device 106 according to an embodiment of the present invention.

Figure 3C:
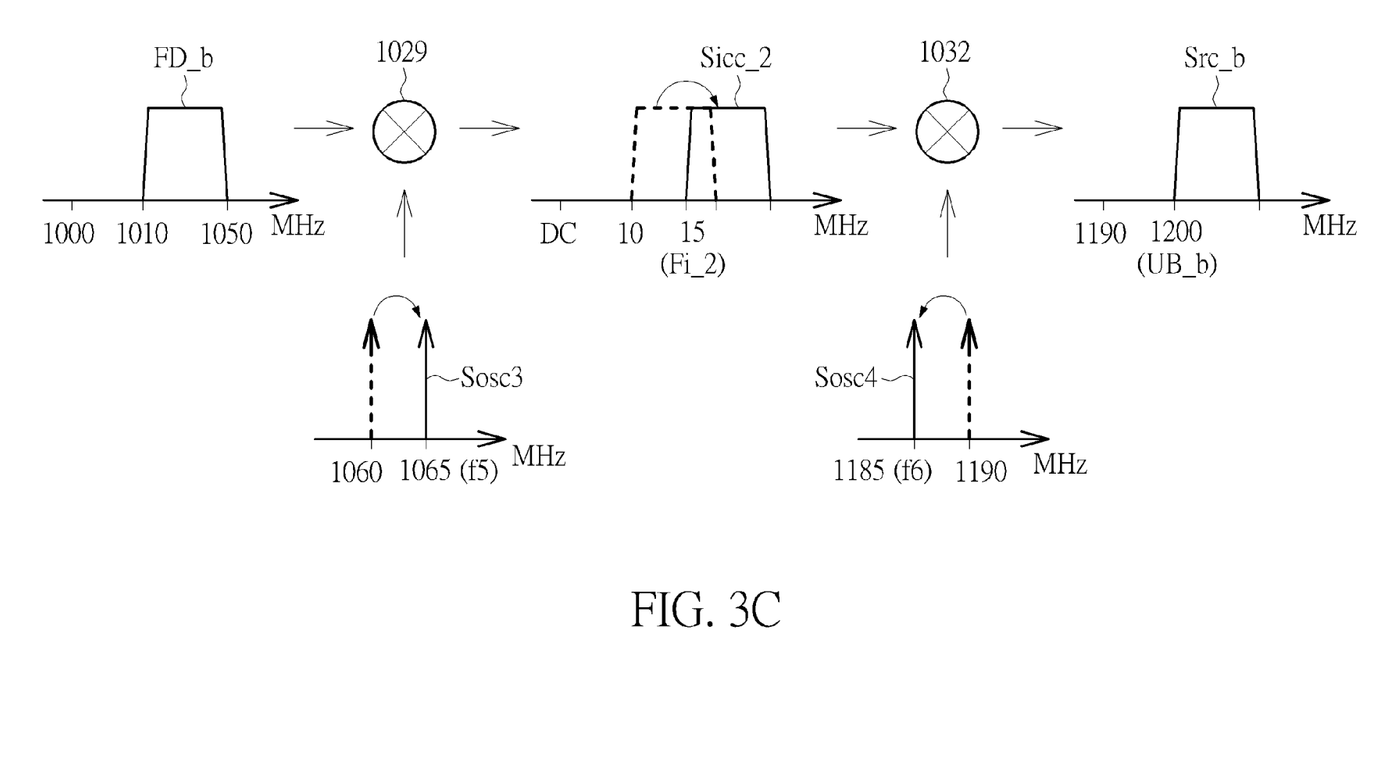
FIG. 3C is a spectrum diagram illustrating the receiving of a channel (e.g. FD_b) in an RF signal bank by using a second modulating device after the adjustment of an adjusting device according to an embodiment of the present invention.

According to FIG. 3A and FIG. 3B, however, it can be seen that the frequency f1 of the first oscillating signal Sosc1 is equal to the third frequency f3 of the third oscillating signal Sosc3, i.e. 1060 MHz. Accordingly, the first oscillating signal Sosc1 and the third oscillating signal Sosc3 may interference with each other under this circumstance. To avoid this problem, when the present determination device 104 determines that the third frequency f3 of the third oscillating signal Sosc3 to be used by the second modulating device 102_b is substantially equal to the first frequency f1 of the first oscillating signal Sosc1 that is used by the first modulating device 102_a, the determination device 104 may control the adjusting device 106 to shift the frequency of the third oscillating signal Sosc3 by the predetermined frequency range fs, e.g. 5 MHz, to be 1065 MHz. Meanwhile, the determination device 104 also controls the adjusting device 106 to shift the frequency of the fourth oscillating signal Sosc4 by the predetermined frequency range fs, i.e. 5 MHz, to be 1185 MHz as shown in FIG. 3C. FIG. 3C is a spectrum diagram illustrating the receiving of the channel FD_b in the Bank_b by using the second modulating device 102_b after the adjustment of the adjusting device 106 according to an embodiment of the present invention. In this embodiment, the adjusting device 106 increases the frequency of the third oscillating signal Sosc3 and reduces the frequency of the fourth oscillating signal Sosc4 by 5 MHz when the frequency of the third oscillating signal Sosc3 to be used by the second modulating device 102_b is substantially equal to the frequency f1 of the first oscillating signal Sosc1 used by the first modulating device 102_a. However, this is not the limitation of the present invention. The adjusting device 106 may reduce the frequency of the third oscillating signal Sosc3 and increase the frequency of the fourth oscillating signal Sosc4 by 5 MHz when the frequency of the third oscillating signal Sosc3 to be used by the second modulating device 102_b is substantially equal to the frequency f1 of the first oscillating signal Sosc1 used by the first modulating device 102_a According to FIG. 3C, after the frequency of the third oscillating signal Sosc3 is changed to 1065 MHz, the second intermediate frequency Fi_2 of the second combined intermediate channel Sicc_2 is changed to 15 MHz from the 10 MHz. However, as the frequency of the fourth oscillating signal Sosc4 is changed to 1185 MHz from 1190 MHz, the second predetermined frequency UB_b of the second received channel Src_b is still located in 1200 MHz, which is the user-band assigned for the second user, after the up-conversion of the second mixing circuit 1032.

Accordingly, after the adjustment performed by the adjusting device 106, the frequency (i.e. the above mentioned frequency f5) of the adjusted third oscillating signal Sosc3 is different from the frequency f1 of the first oscillating signal Sosc1. Therefore, the first oscillating signal Sosc1 used by the first modulating device 102_a and the adjusted oscillating signal Sosc3 used by the second modulating device 102_b do not interfere with each other.

It should be noted that the above description is focused on solving the interference between the first oscillating signal Sosc1 received by the first mixing circuit 1023 and the third oscillating signal Sosc3 received by the first mixing circuit 1029. However, this is not the limitation of the present invention. Take the first modulating device 102_ as an example, the idea may also work in adjusting the frequency of the second oscillating signal Sosc2 and the frequency of the first oscillating signal Sosc1 if the frequency f2 of the second oscillating signal Sosc2 received by the second mixing circuit 1026 and the frequency f1 of the first oscillating signal Sosc1 received by the first mixing 1023 are determined to be equal.

Figure 4A:
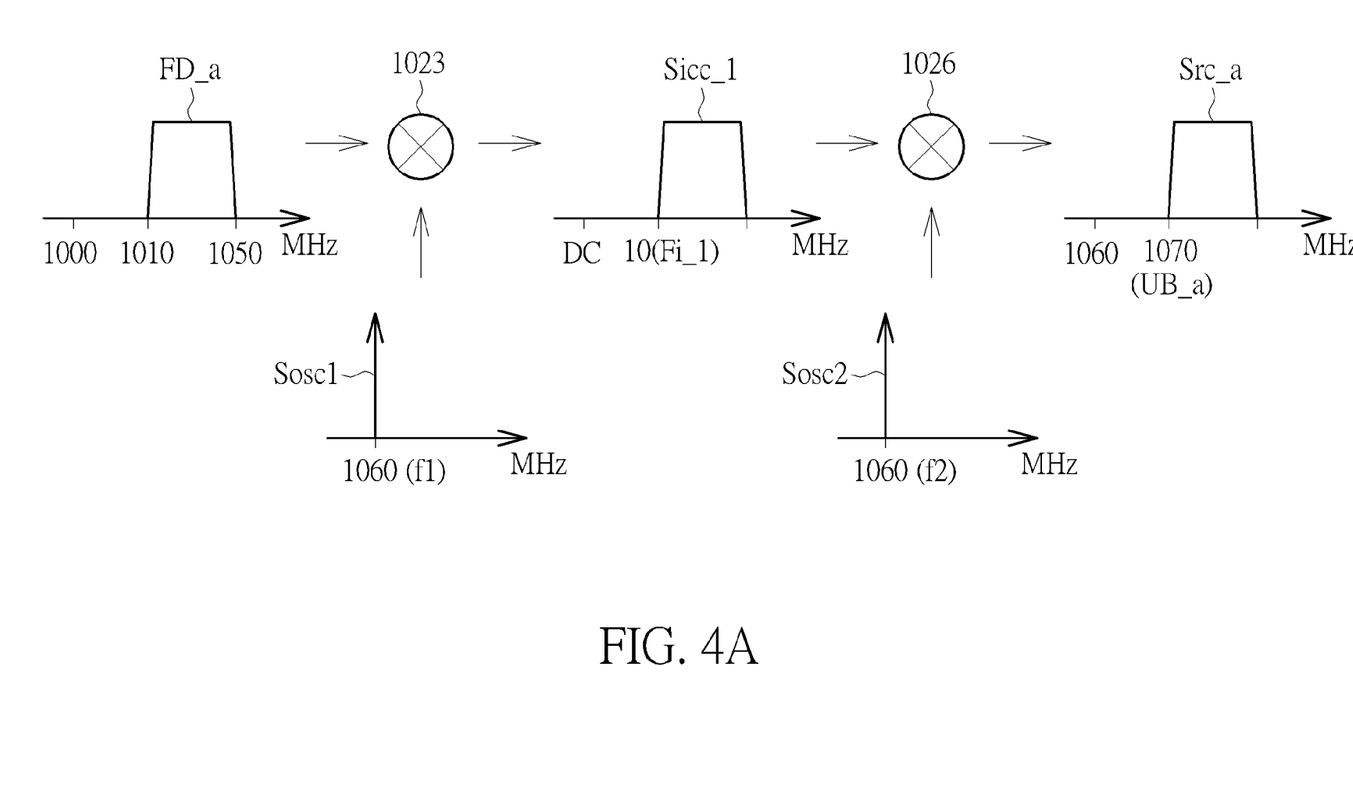
FIG. 4A is a spectrum diagram illustrating the receiving of a channel in a bank by using a first modulating device according to another embodiment of the present invention.
Figure 4B:
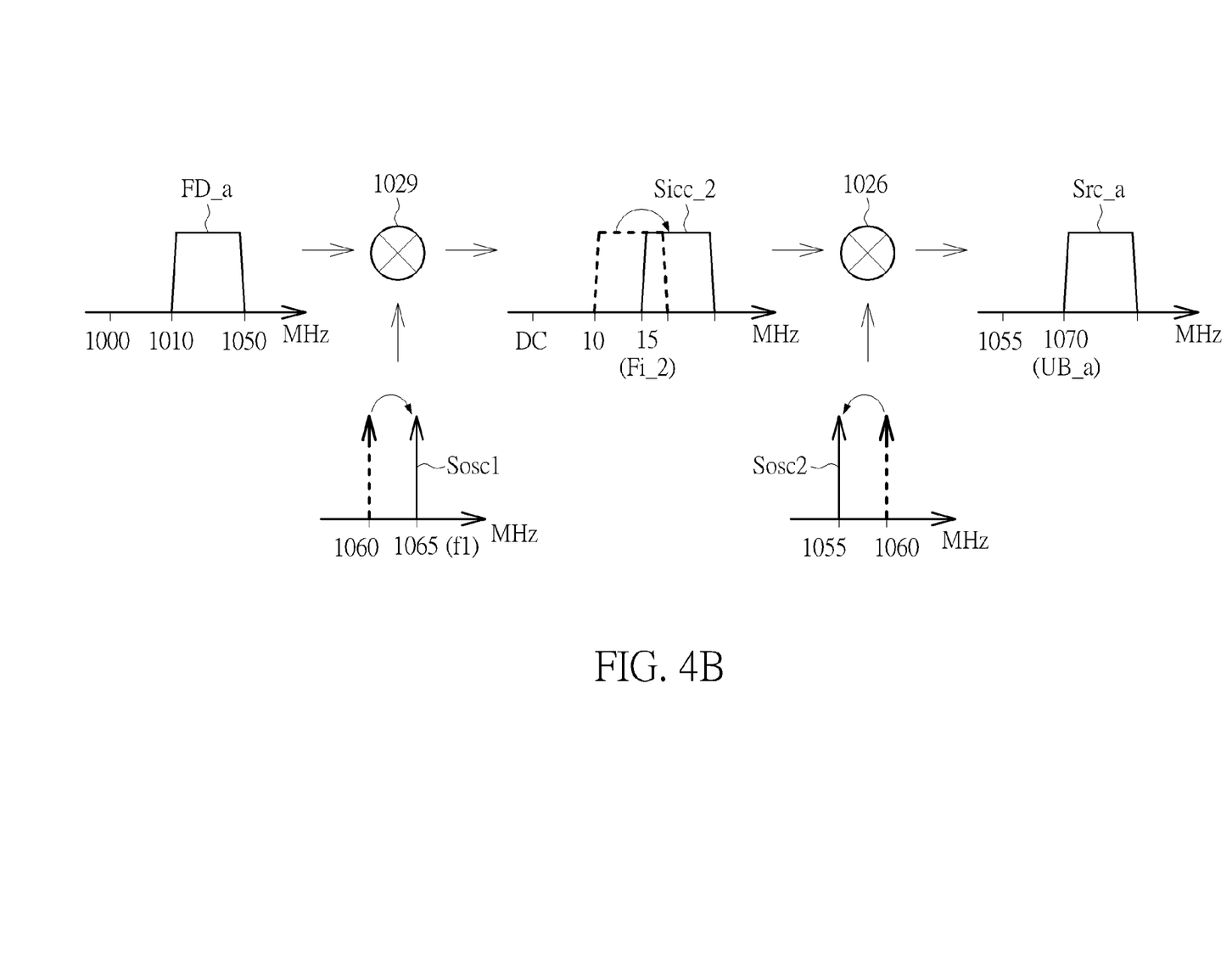
FIG. 4B is a spectrum diagram illustrating the receiving of a channel in a bank by using a first modulating device after the adjustment of an adjusting device according to an embodiment of the present invention.

Please refer to FIG. 4A, which is a spectrum diagram illustrating the receiving of the channel FD_a in the Bank_c by using the first modulating device 102_a according to another embodiment of the present invention. Now, in this embodiment, if the user-band (i.e. the first predetermined frequency UB_a) in the stacked receiving channel Stc assigned for the first user is on 1070 MHz, and if the frequency f1 of the first oscillating signal Sosc1 received by the first mixing circuit 1023 is equal to the frequency f2 of the second oscillating signal Sosc2 received by the second mixing 1026, i.e. 1060 MHz, then the first oscillating signal Sosc1 and the second oscillating signal Sosc2 should be shifted by the predetermined frequency range fs as shown in FIG. 4B. FIG. 4B is a spectrum diagram illustrating the receiving of the channel FD_a in the Bank_c by using the first modulating device 102_a after the adjustment of the adjusting device 106 according to an embodiment of the present invention. In this embodiment, the adjusting device 106 increases the frequency f1 of the first oscillating signal Sosc1 by the predetermined frequency range fs (e.g. 5) and decreases the frequency f2 of the second oscillating signal Sosc2 by the predetermined frequency range fs to make the user-band kept on 1070 MHz when the determination device 104 determines that the frequency f1 is equal to the frequency f2. However, this is not the limitation of the present invention. The adjusting device 106 may decreases the frequency f1 of the first oscillating signal Sosc1 by the predetermined frequency range fs (e.g. 5) and increases the frequency f2 of the second oscillating signal Sosc2 by the predetermined frequency range fs to make the user-band kept on 1070 MHz.

According to FIG. 4B, after the frequency f1 of the first oscillating signal Sosc1 is changed to 1065 MHz and the frequency f2 of the second oscillating signal Sosc2 is changed to 1055 MHz, the first oscillating signal Sosc1 used by the first mixing circuit 1023 and the second oscillating signal Sosc2 used by the second mixing circuit 1026 do not interfere with each other.

Accordingly, the determination device 104 as shown in FIG. 1 is also arranged to couple to the first synthesizer 1021 and the second synthesizer 1025 for determining if the frequency of the first oscillating signal Sosc1 is equal to the frequency of the second oscillating signal Sosc2. The adjusting device 106 is arranged to also couple to the first synthesizer 1021 and the second synthesizer 1025. If the frequency of the first oscillating signal Sosc1 is equal to the frequency of the second oscillating signal Sosc2, the adjusting device 106 is arranged to shift the first oscillating signal Sosc1 and the second oscillating signal Sosc2 by the predetermined frequency range fs. The similar determining and adjusting operation can also applied to the other modulating devices 102b~102_m. As one ordinary skilled in the art is appreciated to understand the similar determination and adjustment of the other modulating devices 102_b~102_m s, the detailed operation is omitted here for brevity. In addition, the predetermined frequency range fs may be an adjustable value, i.e. the shifting frequency range for one modulating device may different from the shifting frequency range for another modulating device.

According to the operation of the above embodiments, for one modulating device, the modulating device performs two frequency conversion operations to receive a channel in a bank. The first frequency conversion operation is to down-convert the channel into intermediate frequency/low intermediate frequency/baseband level to generate an intermediate channel by a first oscillating signal, and the second frequency conversion operation is to up-convert the intermediate channel into a received channel on the required user band by a second oscillating signal. Then, the received channel is combined with the other received channels of the other modulating devices as a stacked receiving channel for transmitting to the end users.

According to the operation of the modulating device, when the frequencies of the first oscillating signal and the second oscillating signal are shifted by a same frequency range (i.e. the predetermined frequency range fs), the received channel is still located on the predetermined frequency, i.e. the predetermined user-band assigned for the user. Therefore, the first oscillating signal and the second oscillating signal of one modulating device can be shifted by the same frequency range when one of the frequencies of the first oscillating signal and the second oscillating signal of the modulating device is equal to the frequency of another oscillating signal used in another modulating device. Moreover, if the first oscillating signal and the second oscillating signal in one modulating device is detected to have the same frequency, both the first oscillating signal and the second oscillating signal are shifted by the predetermined frequency range fs in different direction to keep the user band intact. Accordingly, the interference problem between the two modulating devices can be avoided.

Figure 5:
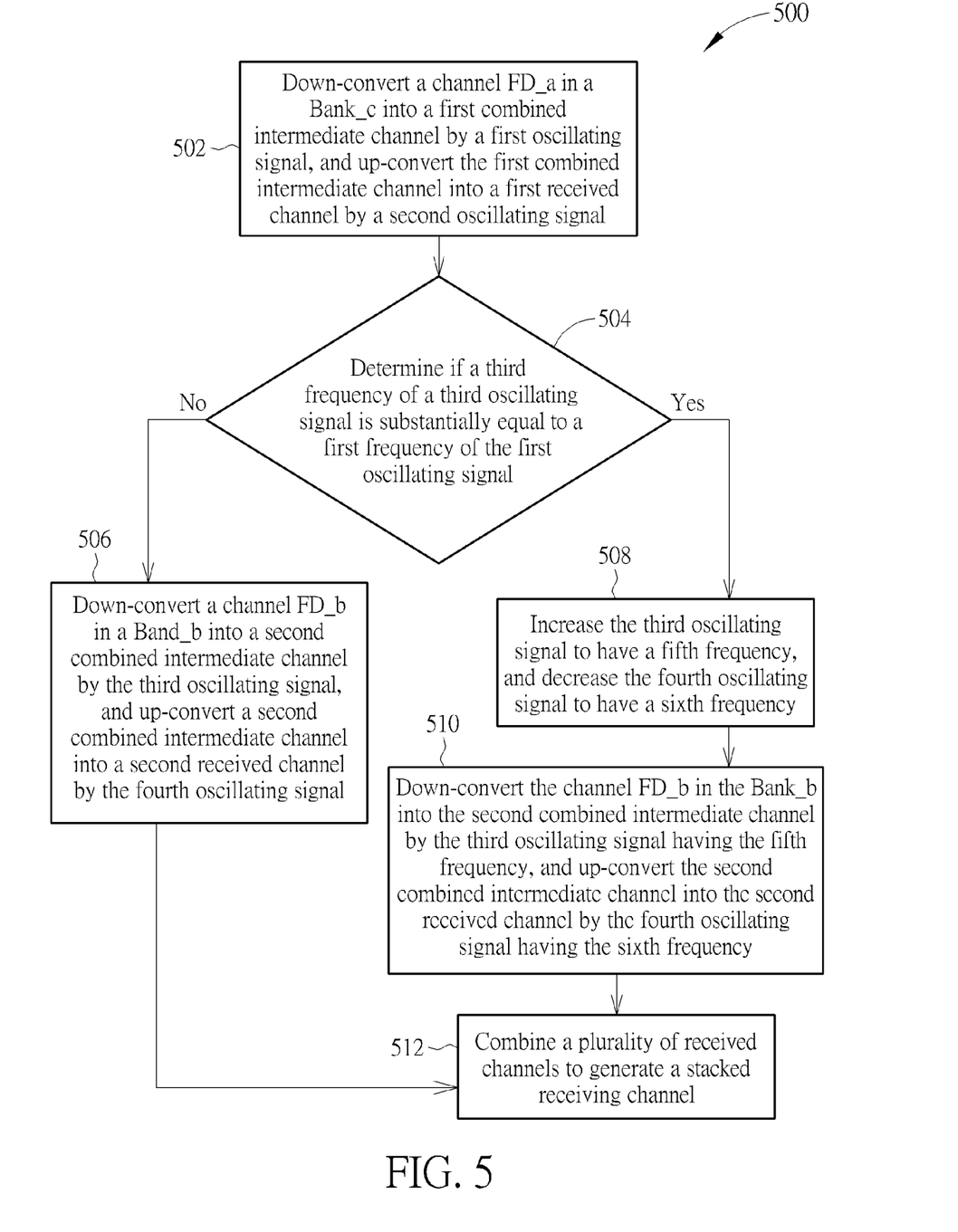
FIG. 5 is a flowchart illustrating a channel receiving method according to an embodiment of the present invention.

In summary, the operation of the above first modulating device 102_a and the second modulating device 102_b of FIG. 3A-3C can be summarized into the steps in FIG. 5. FIG. 5 is a flowchart illustrating a channel receiving method 500 according to an embodiment of the present invention. Provided that substantially the same result is achieved, the steps of the flowchart shown in FIG. 5 need not be in the exact order shown and need not be contiguous, that is, other steps can be intermediate. The channel receiving method 500 comprises the following steps:

Step 502: Down-convert the channel FD_a in the Bank_c into the first combined intermediate channel Sicc_1 by the first oscillating signal Sosc1 having the first frequency f1, and up-convert the first combined intermediate channel Sicc_1 into the first received channel Src_a having the first predetermined frequency UB_a by the second oscillating signal Sosc2 having the second frequency f2;

Step 504: Determine if the third frequency f3 of the third oscillating signal Sosc3 is substantially equal to the first frequency f1 of the first oscillating signal Sosc1, if no, go to step 506, if yes, go to step 508;

Step 506: Down-convert the channel FD_b in the Bank_b into the second combined intermediate channel Sicc_2 by the third oscillating signal Sosc3 having the third frequency f3, and up-convert the second combined intermediate channel Sicc_2 into the second received channel Src_b having the second predetermined frequency UB_b by the fourth oscillating signal Sosc4 having the fourth frequency f4, go to step 512;

Step 508: Increase the third oscillating signal Sosc3 by the predetermined frequency range fs to have the fifth frequency f5, and decrease the fourth oscillating signal Sosc4 by the predetermined frequency range fs to have the sixth frequency f6;

Step 510: Down-convert the channel FD_b in the Bank_b into the second combined intermediate channel Sicc_2 by the third oscillating signal Sosc3 having the fifth frequency f5, and up-convert the second combined intermediate channel Sicc_2 into the second received channel Src_b having the second predetermined frequency UB_b by the fourth oscillating signal Sosc4 having the sixth frequency f6;

Step 512: Combine the plurality of received channels Src_a~Src_m to generate the stacked receiving channel Stc for transmitting to the end users.

Figure 6:
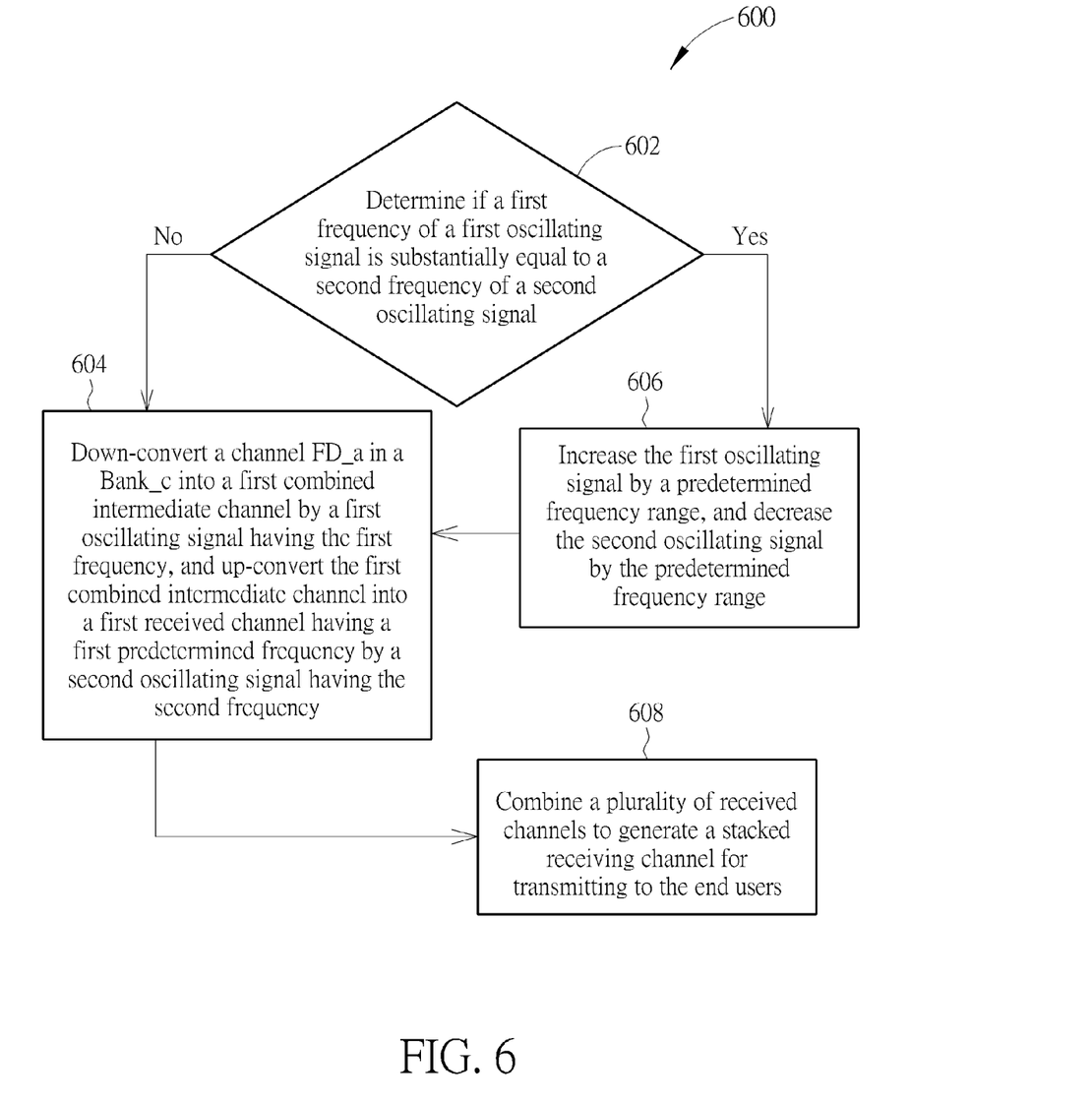
FIG. 6 is a flowchart illustrating a channel receiving method according to another embodiment of the present invention.

The operation of the above first modulating device 102_a of FIG. 4A-4B can be summarized into the steps in FIG. 6. FIG. 6 is a flowchart illustrating a channel receiving method 600 according to another embodiment of the present invention. Provided that substantially the same result is achieved, the steps of the flowchart shown in FIG. 6 need not be in the exact order shown and need not be contiguous, that is, other steps can be intermediate. The channel receiving method 600 comprises the following steps:

Step 602: Determine if the first frequency f1 of the first oscillating signal Sosc1 is substantially equal to the second frequency f2 of the second oscillating signal Sosc2, if no, go to step 604, if yes, go to step 606;

Step 604: Down-convert the channel FD_a in the Bank_c into the first combined intermediate channel Sicc_1 by the first oscillating signal Sosc1 having the first frequency f1, and up-convert the first combined intermediate channel Sicc_1 into the first received channel Src_a having the first predetermined frequency UB_a by the second oscillating signal Sosc2 having the second frequency f2, go to step 608;

Step 606: Increase the first oscillating signal Sosc1 by the predetermined frequency range fs, and decrease the second oscillating signal Sosc2 by the predetermined frequency range fs, go to step 604; and Step 608: Combine the plurality of received channels Src_a~Src_m to generate the stacked receiving channel Stc for transmitting to the end users.

Briefly, according to the above embodiments, the present invention performs two frequency conversion operations, i.e. the down-conversion and the up-conversion, to receive the Bank_a~Bank_m. When the frequency of the first oscillating signal used in down-conversion or the frequency of the second oscillating signal used in up-conversion in one modulating device is detected to be equal to the frequency of another oscillating signal used in another modulating device, the first oscillating signal and the second oscillating signal are arranged to be shifted by the same frequency range to solve the interference problem between the two modulating devices. When the frequency of the first oscillating signal used in the first down-conversion in one modulating device is detected to be equal to the frequency of the second oscillating signal used in the second down-conversion in the modulating device, the first oscillating signal and the second oscillating signal are arranged to be shifted by the same frequency range to solve the interference problem between the two the oscillating signals. Therefore, the signal quality of the stacked receiving channel Stc is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A channel receiving apparatus, comprising:
   a first modulating device, arranged to convert a first channel into a first predetermined frequency according to a first oscillating signal and a second oscillating signal; and a second modulating device, arranged to convert a second channel into a second predetermined frequency according to a third oscillating signal and a fourth oscillating signal;

wherein the first oscillating signal has a first frequency, the second oscillating signal has a second frequency, the third oscillating signal has a third frequency, and the fourth oscillating signal has a fourth frequency, and when the third frequency is substantially equal to the first frequency, the third oscillating signal is arranged to be shifted by a predetermined frequency range to have a fifth frequency different from the first frequency.

2. The channel receiving apparatus of claim 1, wherein when the third frequency is substantially equal to the first frequency, the fourth oscillating signal is also arranged to be shifted by the predetermined frequency range to have a sixth frequency.

3. The channel receiving apparatus of claim 2, wherein when the third frequency is substantially equal to the first frequency, the third oscillating signal and the fourth oscillating signal are arranged to be shifted by the predetermined frequency range in a different direction.

4. The channel receiving apparatus of claim 1, wherein when the first frequency is substantially equal to the second frequency, the first oscillating signal and the second oscillating signal are arranged to be shifted by the predetermined frequency range in a different direction.

5. The channel receiving apparatus of claim 1, further comprising:
   a determination device, coupled to the first modulating device and the second modulating device, for determining if the third frequency is substantially equal to the first frequency; and
   an adjusting device, coupled to the determination device, for adjusting the third oscillating signal to be shifted by the predetermined frequency range to have the fifth frequency when the determination device determines that the third frequency is substantially equal to the first frequency.

6. The channel receiving apparatus of claim 5, wherein the adjusting device further adjusts the fourth oscillating signal to be shifted by the predetermined frequency range to have a sixth frequency when the determination device determines that the third frequency is substantially equal to the first frequency.

7. The channel receiving apparatus of claim 5, wherein the determination device further determines if the first frequency is substantially equal to the second frequency, and the adjusting device further adjusts the first frequency and the second frequency to be shifted by the predetermined frequency range when the determination device determines that the first frequency is substantially equal to the second frequency.

8. The channel receiving apparatus of claim 1, wherein the first modulating device is arranged to down-convert the first channel into a first intermediate frequency to generate a first intermediate channel according to the first oscillating signal and to up-convert the first intermediate channel to generate a first received channel having the first predetermined frequency according to the second oscillating signal, and the second modulating device is arranged to down-convert the second channel into a second intermediate frequency to generate a second intermediate channel according to the third oscillating signal and to up-convert the second intermediate channel to generate a second received channel having the second predetermined frequency according to the fourth oscillating signal.

9. The channel receiving apparatus of claim 8, further comprising:
   a combining circuit, coupled to the first modulating device and the second modulating device, for combining the first received channel and the second received channel to generate a stacked receiving channel.

10. The channel receiving apparatus of claim 8, wherein the first modulating device comprises:
    a first mixing circuit, arranged to modulate the first channel to generate a first in-phase intermediate channel having the first intermediate frequency and a first quadrature intermediate channel having the first intermediate frequency according to the first oscillating signal;
    a first filter, coupled to the first mixing circuit, for filtering the first in-phase intermediate channel and the first quadrature intermediate channel to generate a first combined intermediate channel; and
    a second mixing circuit, arranged to modulate the first combined intermediate channel to generate a first received channel having the first predetermined frequency according to the second oscillating signal.

11. The channel receiving apparatus of claim 10, wherein the first mixing circuit comprises:
    a first mixer, arranged to mix the first channel with a first in-phase oscillating signal to generate the first in-phase intermediate channel; and
    a second mixer, arranged to mix the first channel with a first quadrature oscillating signal to generate the first quadrature intermediate channel; and
    the channel receiving apparatus further comprises:
    a first synthesizer, arranged to generate the first oscillating signal;
    a first phase splitter, coupled to the first synthesizer, for generating the first in-phase oscillating signal and the first quadrature oscillating signal according to the first oscillating signal; and
    a second synthesizer, arranged to generate the second oscillating signal.

12. The channel receiving apparatus of claim 8, wherein the second modulating device comprises:
    a first mixing circuit, arranged to modulate the second channel to generate a second in-phase intermediate channel having the second intermediate frequency and a second quadrature intermediate channel having the second intermediate frequency according to the third oscillating signal;
    a first filter, coupled to the first mixing circuit, for filtering the second in-phase intermediate channel and the second quadrature intermediate channel to generate a second combined intermediate channel; and
    a second mixing circuit, arranged to modulate the second combined intermediate channel to generate a second received channel having the second predetermined frequency according to the fourth oscillating signal.

13. The channel receiving apparatus of claim 12, wherein the first mixing circuit comprises:
    a first mixer, arranged to mix the second channel with a second in-phase oscillating signal to generate the second in-phase intermediate channel; and
    a second mixer, arranged to mix the second channel with a second quadrature oscillating signal to generate the second quadrature intermediate channel; and
    the channel receiving apparatus further comprises:
    a first synthesizer, arranged to generate the third oscillating signal;

a first phase splitter, coupled to the first synthesizer, for generating the second in-phase oscillating signal and second quadrature oscillating signal according to the third oscillating signal; and a second synthesizer, arranged to generate the fourth oscillating signal.

14. A channel receiving method, performed by an apparatus, comprising:
converting a first channel into a first predetermined frequency according to a first oscillating signal and a second oscillating signal;
converting a second channel into a second predetermined frequency according to a third oscillating signal and a fourth oscillating signal, wherein the first oscillating signal has a first frequency, the second oscillating signal has a second frequency, the third oscillating signal has a third frequency, and the fourth oscillating signal has a fourth frequency; and
when the third frequency is substantially equal to the first frequency, arranging the third oscillating signal to be shifted by a predetermined frequency range to have a fifth frequency different from the first frequency.

15. The channel receiving method of claim 14, further comprising:
when the third frequency is substantially equal to the first frequency, arranging the fourth oscillating signal to be shifted by the predetermined frequency range to have a sixth frequency.

16. The channel receiving method of claim 15, wherein when the third frequency is substantially equal to the first frequency, the third oscillating signal and the fourth oscillating signal are arranged to be shifted by the predetermined frequency range in a different direction.

17. The channel receiving method of claim 14, wherein when the first frequency is substantially equal to the second frequency, the first oscillating signal and the second oscillating signal are arranged to be shifted by the predetermined frequency range in a different direction.

18. The channel receiving method of claim 14, further comprising:
determining if the third frequency is substantially equal to the first frequency; and
adjusting the third oscillating signal to be shifted by the predetermined frequency range to have the fifth frequency when determining that the third frequency is substantially equal to the first frequency.

19. The channel receiving method of claim 18, further comprising:
adjusting the fourth oscillating signal to be shifted by the predetermined frequency range to have a sixth frequency when determining that the third frequency is substantially equal to the first frequency.

20. The channel receiving method of claim 18, further comprising:
determining if the first frequency is substantially equal to the second frequency; and
adjusting the first frequency and the second frequency to be shifted by the predetermined frequency range when the first frequency is substantially equal to the second frequency.

21. The channel receiving method of claim 14, wherein the step of converting the first channel into the first predetermined frequency according to the first oscillating signal and the second oscillating signal comprises:
down-converting the first channel into a first intermediate frequency to generate a first intermediate channel according to the first oscillating signal; and
up-converting the first intermediate channel to generate a first received channel having the first predetermined frequency according to the second oscillating signal; and
the step of converting the second channel into the second predetermined frequency according to the third oscillating signal and the fourth oscillating signal comprises:
down-converting the second channel into a second intermediate frequency to generate a second intermediate channel according to the third oscillating signal; and
up-converting the second intermediate channel to generate a second received channel having the second predetermined frequency according to the fourth oscillating signal.

22. The channel receiving method of claim 21, further comprising:
combining the first received channel and the second received channel to generate a stacked receiving channel.

23. The channel receiving method of claim 21, wherein the step of down-converting the first channel into the first intermediate frequency to generate the first intermediate channel according to the first oscillating signal comprises:
modulating the first channel to generate a first in-phase intermediate channel having the first intermediate frequency and a first quadrature intermediate channel having the first intermediate frequency according to the first oscillating signal; and
filtering the first in-phase intermediate channel and the first quadrature intermediate channel to generate the first intermediate channel; and
the step of up-converting the first intermediate channel to generate the first received channel having the first predetermined frequency according to the second oscillating signal comprises:
modulating the first intermediate channel to generate a first received channel having the first predetermined frequency according to the second oscillating signal.

24. The channel receiving method of claim 23, wherein the step of modulating the first channel to generate the first in-phase intermediate channel having the first intermediate frequency and the first quadrature intermediate channel having the first intermediate frequency according to the first oscillating signal comprises:
mixing the first channel with a first in-phase oscillating signal to generate the first in-phase intermediate channel;
mixing the first channel with a first quadrature oscillating signal to generate the first quadrature intermediate channel; and
the channel receiving method further comprises:
generating the first oscillating signal;
generating the first in-phase oscillating signal and first quadrature oscillating signal according to the first oscillating signal; and
generating the second oscillating signal.

25. The channel receiving method of claim 21, wherein the step of down-converting the second channel into the second intermediate frequency to generate the second intermediate channel according to the third oscillating signal comprises:
modulating the second channel to generate a second in-phase intermediate channel having the second intermediate frequency and a second quadrature intermediate channel having the second intermediate frequency according to the third oscillating signal; and
filtering the second in-phase intermediate channel and the second quadrature intermediate channel to generate the second intermediate channel; and the step of up-converting the second intermediate channel to generate the second received channel having the second predetermined frequency according to the fourth oscillating signal comprises:

modulating the second intermediate channel to generate a second received channel having the second predetermined frequency according to the fourth oscillating signal.

26. The channel receiving method of claim 25, wherein the step of modulating the second channel to generate the second in-phase intermediate channel having the second intermediate frequency and the second quadrature intermediate channel having the second intermediate frequency according to the third oscillating signal comprises:

mixing the second channel with a second in-phase oscillating signal to generate the second in-phase intermediate channel; and     mixing the second channel with a second quadrature oscillating signal to generate the second quadrature intermediate channel; and the channel receiving method further comprises:

generating the third oscillating signal;

generating the second in-phase oscillating signal and the second quadrature oscillating signal according to the third oscillating signal; and     generating the fourth oscillating signal.

\* \* \* \* \*